(12) United States Patent
Tsuji et al.

(10) Patent No.: US 6,291,835 B1
(45) Date of Patent: Sep. 18, 2001

(54) SEMICONDUCTOR DEVICE

(75) Inventors: Nobuaki Tsuji; Masahiro Ito, both of Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 09/577,370

(22) Filed: May 23, 2000

(30) Foreign Application Priority Data

May 26, 1999 (JP) .................................................. 11-147211

(51) Int. Cl.[7] .......................... H01L 23/58; H01L 23/544
(52) U.S. Cl. ............................ 257/48; 257/618; 257/623; 257/692; 257/786; 257/620; 438/68; 438/113; 438/460; 438/462; 438/620
(58) Field of Search ..................................... 257/620, 623, 257/48, 618, 692, 786; 438/460, 462, 48, 68, 113, 620

(56) References Cited

U.S. PATENT DOCUMENTS

| | | | |
|---|---|---|---|
| 4,835,592 | * 5/1989 | Zommer | 357/68 |
| 5,239,191 | * 8/1993 | Sakumoto et al. | 257/203 |
| 5,285,082 | * 2/1994 | Axer | 257/48 |
| 6,121,677 | * 9/2000 | Song et al. | 257/692 |
| 6,174,789 | * 1/2001 | Tsukada | 438/462 |
| 6,194,739 | * 2/2001 | Ivanov et al. | 257/48 |

FOREIGN PATENT DOCUMENTS

| | | |
|---|---|---|
| 57-113241 | 7/1982 | (JP) . |
| 59-14663 | 1/1984 | (JP) . |
| 2-211649-A | * 8/1990 | (JP) . |
| 5-299484-A | * 11/1993 | (JP) . |
| 7-120696 | 12/1995 | (JP) . |

\* cited by examiner

Primary Examiner—Steven Loke
Assistant Examiner—Donghee Kang
(74) Attorney, Agent, or Firm—Reed Smith Hazel & Thomas LLP

(57) ABSTRACT

Bonding pads (3) are arranged on the outer side of an in-chip circuit region (2) of a semiconductor integrated circuit board (1), and a scribed line (4) for chip separation is formed on the outer side thereof. A corner portion (4a) of the scribed line (4) is formed to be wider than a remaining portion (4b) thereof, and a wafer test circuit (5) and test pads (6) are formed in the corner portion (4a).

3 Claims, 1 Drawing Sheet

FIGURE
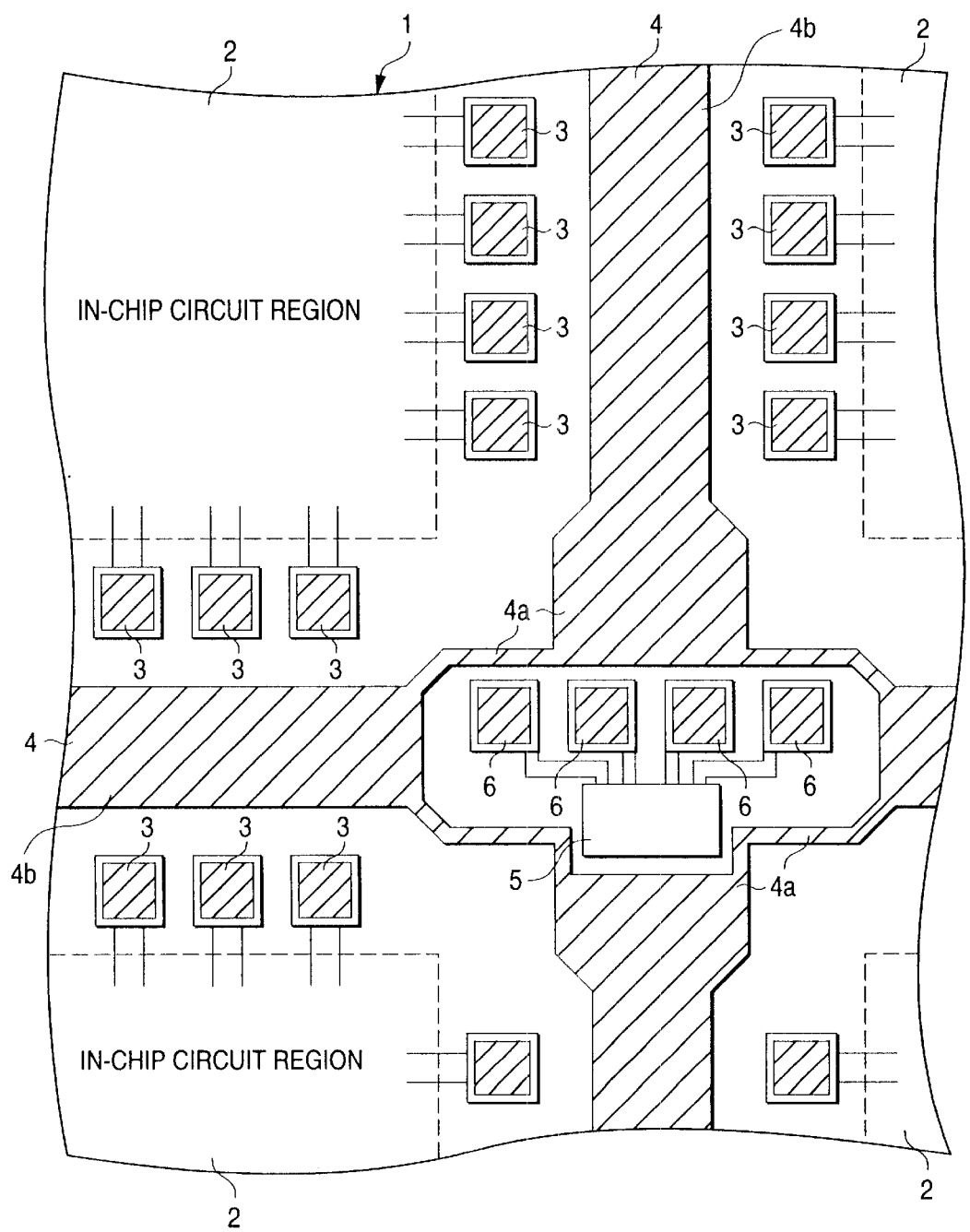

SEMICONDUCTOR DEVICE

BACKGROUND OF THE INVENTION

1. Field of the Invention

The present invention relates to a semiconductor device. More particularly, the present invention relates to a structure of scribed lines which are formed in a semiconductor substrate and provided for separating chips.

The present application is based on Japanese Patent Application No. Hei. 11-147211, which is incorporated herein by reference.

2. Description of the Related Art

In forming semiconductor devices, a plurality of integrated circuits and the like are generally formed simultaneously on a single semiconductor substrate, and are finally separated along scribed lines. The scribed line is a linear region having a predetermined width where the processing of separation grooves for chip separation is allowed. Conventionally, a number of techniques for forming semiconductor elements and the like for testing, on the scribed lines have been proposed. For example, Japanese Patent Application Laid-Open No. Sho. 57-113241 discloses a technique whereby semiconductor elements for measuring the basic characteristics of circuits or manufacturing parameters are formed on the scribed line or its vicinity so as to make effective use of the scribe regions. For example, Japanese Patent Application Laid-Open No. Sho. 59-14663 discloses a technique whereby areas of monitoring semiconductor elements are made large, and the monitoring semiconductor elements are formed along the scribed lines for the purpose of enhancing the accuracy of detection of faulty withstand pressure ascribable to crystal defects. For example, in Examined Japanese Patent Publication No. Hei. 7-120696, an embodiment shown in FIG. 2 shows the formation of a monitor pattern on a scribed line to prevent the degree of integration from declining.

However, with the conventionally proposed techniques described above, the portion of the scribed line where the elements are formed and the remaining portion are formed with a fixed uniform width. In order to secure a large effective area for the chip and to reduce the size of the actual chips that are cut out, the width of the scribed lines is preferably narrow. However, if an attempt is made to secure a fixed region for the testing semiconductor element within the scribed line, the reduction of its width is limited by the testing semiconductor element, and therefore there is a limit.

SUMMARY OF THE INVENTION

Accordingly, it is an object of the present invention to provide a semiconductor device which permits the reduction of the width of the scribed lines and the reduction of the chip size by making use of a corner portion of a scribed lines in the formation of a semiconductor element therein.

According to the present invention, there is provided a semiconductor device which comprises a semiconductor substrate, a plurality of scribed lines formed on the semiconductor substrate to define a plurality of chips, wherein the chips are separable from each other at the scribed lines, at least one corner portion, at which one of the scribed lines and the other one of the scribed lines are connected, formed to be wider than remaining portions of the scribed lines, and a semiconductor element formed in the corner portion.

In other words, the scribed lines may include first portions having the remaining portions, and second portions wider than the first portions. Accordingly, the corner portion may be defined by at least one of the second portions of the scribed lines and a portion to which one of the scribed lines and the other one of the scribed lines are connected.

In the present invention, the semiconductor element used for a wafer test or the like is formed in the corner portion of the scribed lines having a large width. The semiconductor element may be disposed in a wafer test circuit. In this case, the wafer test circuit is formed in the corner portion. Further, the wafer test- circuit may include test pads. The portion in the vicinity of the corner portion of the scribed lines is a vacant area where bonding pads are generally not located. Accordingly, the enlargement of the width of the corner portion of the scribed lines is possible without increasing the chip size and does not reduce the effective area of the chip. Further, the reduction of the chip size becomes possible by making narrow the width of that portion of the scribed lines which excludes the corner portion and where the semiconductor element is not formed.

It should be noted that the range of groove processing at the time of actual chip separation is limited by the narrow portion of the scribed line, so that the enlargement of the width of the corner portion has no significance in the processing for chip separation. In the present invention, the fact that the width of the corner portion of the scribed lines is enlarged becomes significant in limiting the range where the semiconductor element for testing can be formed.

As described above, in accordance with the present invention, since the corner portion of the scribed lines is made wide and a semiconductor element used for testing or the like is formed therein, it is possible to provide a semiconductor device which permits the reduction of the width of the scribed lines and the reduction- of the chip size.

BRIEF DESCRIPTION OF THE DRAWING

A FIGURE is a diagram illustrating the structure of a semiconductor integrated circuit board according to an embodiment of the present invention.

DETAILED DESCRIPTION OF THE PREFERRED EMBODIMENT

A preferred embodiment of the present invention will now be described with reference to a FIGURE.

The FIGURE shows the arrangement of essential portions of a semiconductor integrated circuit board 1 in accordance with an embodiment of the present invention. Regions 2 surrounded by broken lines in the circuit board 1 are in-chip circuit regions (including I/O circuits). Bonding pads 3 for connecting circuit terminals to a leadframe are arranged on the outer side of each in-chip circuit region 2.

A scribed line 4 for separating the chips in the semiconductor integrated circuit board 1 is arranged such that its corner portions 4a are formed to be wide, and the width of its remaining portion 4b is made narrower than the corner portion 4a. It should be noted that the hatched range of the scribed line 4 shows the range where a metal such as aluminum etc. is formed at the same time as the in-chip circuit regions 2, in order to facilitate observation at the time of the processing of separation grooves. Specifically, in this embodiment, the width of the corner portion 4a of the scribed line 4 is set to 152 $\mu$m, and the width of its remaining portion 4b is set to 110 $\mu$m or less.

In addition, a wafer test circuit 5 including a semiconductor element is formed in the corner portion 4a of the scribed line 4 formed with a large width. Also disposed in the corner portion 4a are test pads 6 for measuring the characteristics of the test circuit 5 with a probe in the wafer stage so as to perform a check on faulty products and inspect process conditions.

As shown in the figure, the portion in the vicinity of the corner portions 4a where the scribed lines 4 intersect each other is a vacant area contiguous to the corners of chips where bonding pads are generally not located in view of the relation to the arrangement of the leadframe. Accordingly, the enlargement of this corner portion 4a can be accomplished without increasing the chip size and without affecting the effective area of each in-chip circuit region 2. By making use of this corner portion 4a, it is possible to secure a sufficient area for the test circuit-5 and the test pads 6. Further, the reduction of the chip size can be attained since the width of the portion 4b other than the corner portion 4a is made narrow such that the test elements and the like are not formed therein.

What is claimed is:

1. A semiconductor device, comprising:

a semiconductor substrate;

a plurality of scribed lines formed on the semiconductor substrate to define a plurality of chips, wherein the chips are separable from each other at the scribed lines;

at least one corner portion, at which one of the scribed lines and the other one of the scribed lines are connected, formed to be wider than remaining portions of the scribed lines; and a semiconductor element formed in the corner portion.

2. The semiconductor device of claim 1, wherein the scribed lines include first portions having the remaining portions, and second portions wider than the first portions, and wherein the corner portion is defined by at least one of the second portions of the scribed lines and a portion to which one of the scribed lines and the other one of the scribed lines are connected.

3. The semiconductor device of claim 1, wherein the semiconductor element is disposed in a wafer test circuit including test pads, and the wafer test circuit is formed in the corner portion.

* * * * *